(12) United States Patent
Miyake

(10) Patent No.: US 11,257,920 B2
(45) Date of Patent: Feb. 22, 2022

(54) FASTENING MEMBER AND SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Eitaro Miyake, Kawasaki Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

(*) Notice: Subject to any disclaimer, the term of this patent is extended or adjusted under 35 U.S.C. 154(b) by 0 days.

(21) Appl. No.: 16/540,118

(22) Filed: Aug. 14, 2019

(65) Prior Publication Data

US 2020/0295152 A1 Sep. 17, 2020

(30) Foreign Application Priority Data

Mar. 14, 2019 (JP) .............................. JP2019-047785

(51) Int. Cl.
| | | |
|---|---|---|
| *H01L 23/495* | (2006.01) |
| *H01L 21/44* | (2006.01) |
| *H01L 29/49* | (2006.01) |
| *H01L 29/423* | (2006.01) |
| *H01L 23/48* | (2006.01) |

(52) U.S. Cl.
CPC ............ *H01L 29/49* (2013.01); *H01L 23/481* (2013.01); *H01L 29/4232* (2013.01)

(58) Field of Classification Search
CPC .......................................... H01L 23/481–4824
USPC .......................... 438/611, 666; 257/672, 676
See application file for complete search history.

(56) References Cited

U.S. PATENT DOCUMENTS

| | | | | |
|---|---|---|---|---|
| 8,981,538 B2 * | 3/2015 | Danno | ..................... | H01L 24/97 257/675 |
| 9,831,486 B2 * | 11/2017 | Choi | ..................... | H01M 2/1077 |
| 10,396,481 B2 * | 8/2019 | Lauermann | ............ | H01R 24/76 |
| 10,622,285 B2 * | 4/2020 | Saito | ..................... | H01L 21/561 257/676 |
| 2008/0277774 A1 * | 11/2008 | Hasegawa | ......... | H01L 23/49575 257/693 |

FOREIGN PATENT DOCUMENTS

| | | |
|---|---|---|
| JP | S53-090175 U | 7/1978 |
| JP | S63-005684 A | 1/1988 |
| JP | 2012-023135 A | 2/2012 |

* cited by examiner

*Primary Examiner* — Calvin Lee
(74) *Attorney, Agent, or Firm* — Allen Overy LLP

(57) ABSTRACT

Provided is a fastening member which is a columnar fastening member, and the fastening member includes: a first hole provided in a direction parallel to a height direction of the fastening member; a thread on a side surface of the first hole; a planar portion around the first hole; and a projection between the planar portion and the first hole.

17 Claims, 5 Drawing Sheets

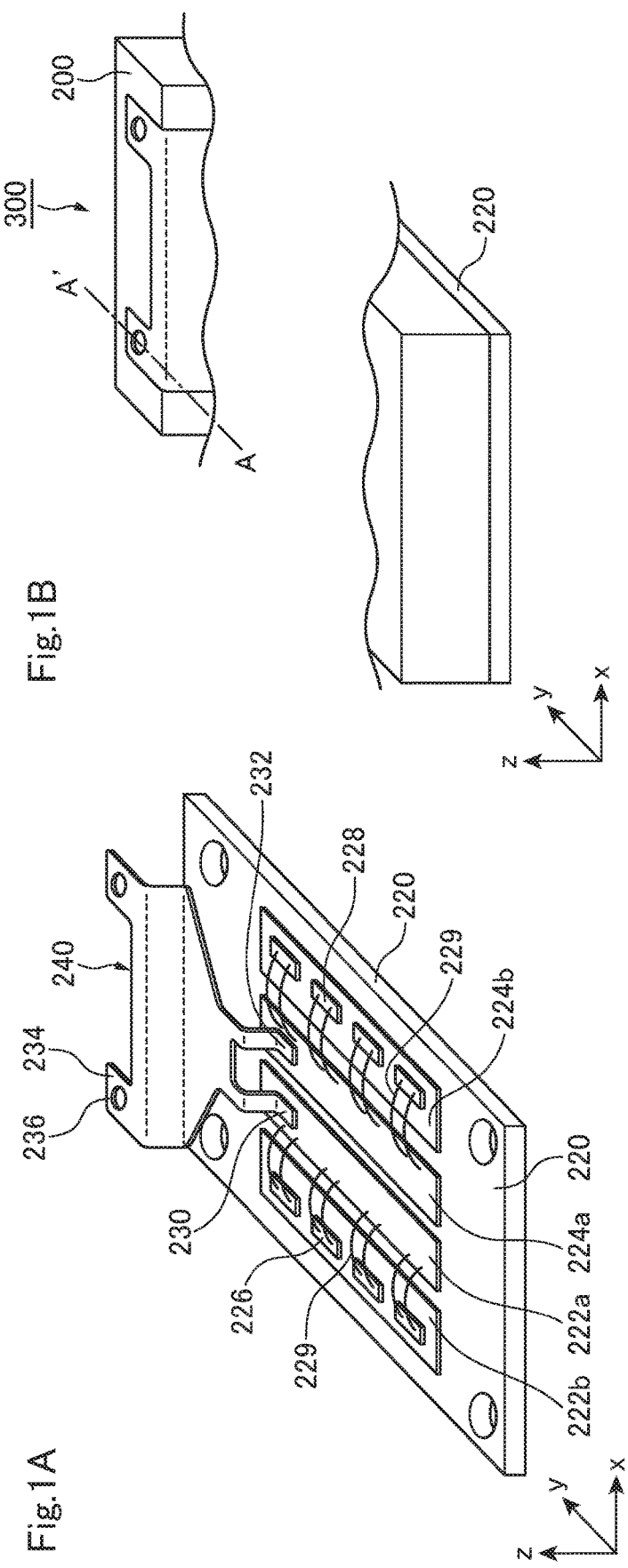

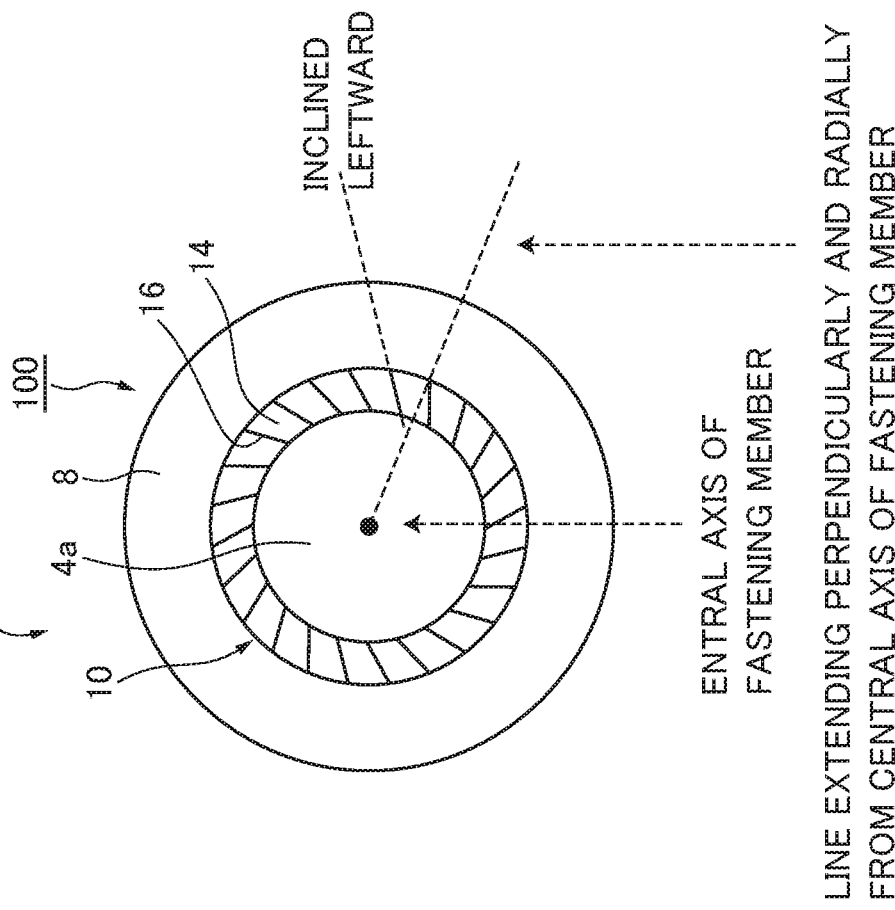
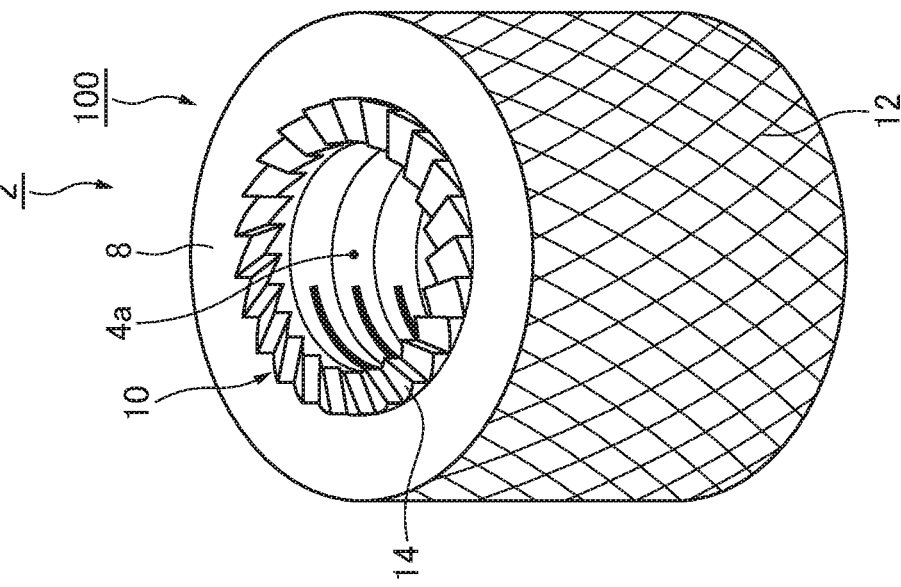

FASTENING MEMBER AND SEMICONDUCTOR DEVICE

CROSS-REFERENCE TO RELATED APPLICATION

This application is based upon and claims the benefit of priority from Japanese Patent Application No. 2019-047785, filed on Mar. 14, 2019, the entire contents of which are incorporated herein by reference.

FIELD

Embodiments described herein relate generally to a fastening member and a semiconductor device.

BACKGROUND

Power semiconductor devices designed for power control, including semiconductor elements such as metal-oxide-semiconductor field-effect-transistors (MOSFETs) and insulated gate bipolar transistors (IGBTs) for a wide range of fields such as power generation and transmission, rotating machines such as pumps and blowers, power supplies for communication systems and factories, railways with AC motors, electric vehicles, and home appliances have been developed.

Usually, in the power semiconductor device, a plurality of semiconductor elements provided on a base (substrates) can be connected in parallel by using bonding wires or terminal plates to enable handling large power. Herein, the terminal plate is provided with holes into which screws (bolts) can be inserted. In addition, the semiconductor device is provided with a case (container) made of, for example, a resin, and portions of the case corresponding to the bottoms of the holes are provided with fastening members (bushes) that can be fastened with, for example, screws (bolts) having a thread (nut portion). A bus bar or the like provided outside the semiconductor device and portions of the holes of the terminal plate are inserted between the screws (bolts) and the fastening members, and the screws (bolts) are fastened and fixed. Therefore, it becomes possible to fix the bus bar or the like and the terminal plate in the state where contact resistance is small.

However, at the time when fastening the screw (bolt), for example, with respect to a right-handed screw, a clockwise force is applied to the screw (bolt). When the clockwise force is applied to the portion of the terminal plate connected in the vicinity of the semiconductor element, the above-described terminal plate is removed from the semiconductor element or the electrode member to which the semiconductor element is connected. For this reason, there is a problem that the electrical connection state between the terminal plate and the semiconductor element is degraded.

In addition, the fastening member is merely inserted into the case (container). Therefore, for example, in a case where a force in the upward direction in which the terminal plate is pulled away from the base (board) is applied to the portion where the terminal plate and the fastening member are fixed, the fastening member is detached from the case. As a result, there was a problem that the above-described terminal plate is removed from the semiconductor element or the electrode member to which the semiconductor element is connected.

BRIEF DESCRIPTION OF THE DRAWINGS

FIGS. 1A to 1C are schematic views of a semiconductor device and a fastening member according to an embodiment;

FIGS. 2A and 2B are schematic views of the fastening member according to the embodiment;

DETAILED DESCRIPTION

Figure 3B:
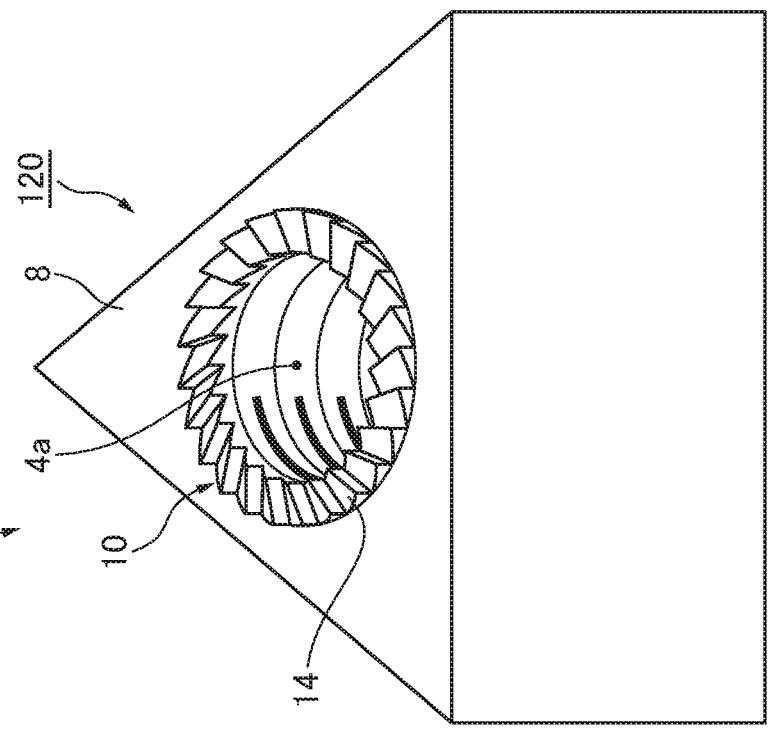
FIGS. 3A and 3B are schematic views of a fastening member according to another aspect of the embodiment.

Hereinafter, embodiments will be described with reference to the drawings. In the drawings, the same or similar components are denoted by the same or similar reference numerals.

In the present specification, the same or similar members will be denoted by the same reference numerals, and redundant descriptions may be omitted.

In the present specification, in order to indicate the positional relationship of parts and the like, the upper direction of the drawing is described as "upper" and the lower direction of the drawing as "lower". In the present specification, the terms "upper" and "lower" are not necessarily terms indicating the relationship with the direction of gravity.

EMBODIMENT

A fastening member of an embodiment is a columnar fastening member and includes a first hole provided in a direction parallel to a height direction of the fastening member, a thread on a side surface of the first hole, a planar portion around the first hole, and a projection between the planar portion and the first hole.

A semiconductor device according to an embodiment includes: a board; a first electrode member provided on the board; a first semiconductor element electrically connected to the first electrode member; a second electrode member provided on the board; a second semiconductor element electrically connected to the second electrode member; a terminal plate having a first plate portion provided on the first electrode member and the first plate portion connected to the first electrode member, a second plate portion provided on the second electrode member and the second plate portion connected to the second electrode member, and a third plate portion provided above the first plate portion and the second plate portion, the third plate portion connected to the first plate portion and the second plate portion, and the third plate portion having a second hole; a container provided on the board, the container surrounding the first electrode member, the first semiconductor element, the second electrode member, and the second semiconductor element and having an accommodating portion disposed under the second hole; and a fastening member provided in the accommodating portion, having a columnar shape, and including a first hole provided in a direction parallel to a height direction, a thread provided on a side surface of the first hole, a planar portion provided around the first hole, and a projection provided between the planar portion and the first hole.

FIGS. 1A to 1C are schematic views of a fastening member 100 and a semiconductor device 300 according to the embodiment. FIG. 1A is a schematic perspective view illustrating a structure around a terminal plate 240 and a semiconductor element in the embodiment. FIG. 1B is a schematic perspective view illustrating a structure of the semiconductor device 300 including a container 200 in the embodiment. FIG. 1C is a schematic cross-sectional view in an A-A' cross section of FIG. 1B for illustrating the fastening member 100 according to the embodiment and a structure in the vicinity of the fastening member 100.

The semiconductor device 300 includes a fastening member 100, a board 220, a first electrode member 222, first semiconductor elements 226, a second electrode member 224, second semiconductor elements 228, bonding wires 229, a container 200 having an accommodating portion 210, and a terminal plate 240.

The fastening member 100 has a first hole 4a, a thread 6, a planar portion 8, a projection 10, and a knurl 12.

The terminal plate 240 has a first plate portion 230, a second plate portion 232, and a third plate portion 234 having a second hole 236.

The semiconductor device 300 according to the embodiment is a power conversion device in which the semiconductor elements are connected by the electrode members, the bonding wires, and the terminal plate.

The board (base) 220 is a plate-shaped board made of, for example, Cu (copper) or AlSiC.

Herein, the x-axis, the y-axis perpendicular to the x-axis, and the z-axis perpendicular to the x-axis and the y-axis are defined. The surface of the board 220 is assumed to be disposed parallel to the xy plane.

The electrode members are provided on the board 220. In FIG. 1A, an electrode member 222a and an electrode member 222b are provided as the first electrode member. In addition, an electrode member 224a and an electrode member 224b are provided as the second electrode member. The electrode member has, for example, a plate member made of copper (Cu). In addition, the electrode member may be, for example, an electrode member configured with two Cu plate members interposing a ceramic plate member such as aluminum nitride (AlN) or silicon nitride (SiN). The electrode member is bonded, for example, on the board 220 by solder or the like.

The semiconductor element is electrically connected to the electrode member. In FIG. 1A, by providing the first semiconductor elements 226 on the electrode member 222b, the bottom surfaces of the first semiconductor elements 226 are electrically connected to the electrode member 222b. In addition, the upper surfaces of the first semiconductor elements 226 are electrically connected to the electrode member 222a by the bonding wires 229. By providing the second semiconductor elements 228 on the electrode member 224b, the bottom surfaces of the second semiconductor elements 228 are connected to the electrode member 224b. In addition, the upper surfaces of the second semiconductor elements 228 are electrically connected to the electrode member 224a by the bonding wires 229. Although the four first semiconductor elements 226 and the four second semiconductor elements 228 are provided, the number of the semiconductor elements is not limited to four.

The semiconductor element is, for example, a vertical insulated gate bipolar transistor (IGBT) or a vertical metal-oxide-semiconductor field effect transistor (MOSFET). In a case where the semiconductor element is a vertical MOSFET, the semiconductor element is electrically connected to the electrode member by a drain electrode (not illustrated) provided on the bottom surface of the semiconductor element. In addition, the semiconductor element is electrically connected to the electrode member by a source electrode and bonding wires (not illustrated) provided on the upper surface of the semiconductor element. In addition, in the embodiment, the type, the conductivity type, and the like of the semiconductor element are not particularly limited.

The first plate portion 230 of the terminal plate 240 is provided on the electrode member 222a and is electrically connected to the electrode member 222a. The second plate portion 232 of the terminal plate 240 is provided on the electrode member 224a and is electrically connected to the electrode member 224a. In addition, the first plate portion 230 and the second plate portion 232 may be electrically connected to the electrode member 222b and the electrode member 224b, respectively.

The third plate portion 234 of the terminal plate 240 is provided above the first plate portion 230 and the second plate portion 232 and has the second hole 236 into which, for example, a bolt of about M5 or more and M10 or less, that is, a bolt diameter of 5 mm or more and 10 mm or less can be inserted.

The terminal plate 240 is preferably formed as an integral component by molding, for example, a Cu plate having a thickness of about 1 mm or more and about 1.5 mm or less by using, for example, a metal plate, because the terminal plate can be easily formed in this manner. However, the method of manufacturing the terminal plate 240 is not limited to this method.

The container 200 is a case made of, for example, a resin. As illustrated in FIG. 1B, the container 200 is provided on the board 220 so as to surround the electrode members, the semiconductor elements, the bonding wires, the first plate portion 230, and the second plate portion 232. And, as illustrated in FIG. 1C, the container 200 has the accommodating portion 210 which can accommodate the fastening member 100 in the portion located under the second hole 236 of the terminal plate 240. The fastening member 100 is provided in the accommodating portion 210.

In addition, a gel such as a silicon gel may be formed on the electrode members, the semiconductor elements, the bonding wires, and the first plate portion 230 and the second plate portion 232 in the container 200.

Next, the fastening member will be described with reference to FIG. 1C and FIGS. 2A and 2B. FIGS. 2A and 2B are schematic views of the fastening member according to the embodiment. FIG. 2A is a schematic perspective view of the fastening member according to the embodiment. FIG. 2B is an upper surface schematic view of the fastening member according to the embodiment.

The fastening member 100 is a columnar member. For example, in FIGS. 2A and 2B, the fastening member 100 is a cylindrical member. The fastening member 100 has the first hole 4a provided in the bottom surface 2 in the direction parallel to the height direction of the fastening member. The first hole 4a is a blind hole, and a thread 6 to which a bolt can be fastened is provided on the side surface of the first hole 4a. The planar portion 8 is provided around the first hole 4a of the bottom surface 2.

The projection 10 is provided between the planar portion 8 and the first hole 4a of the bottom surface 2. In FIGS. 2A and 2B, the projection 10 has tile-shaped members 14 having a generally circular, saw-blade shape and being provided continuously around the first hole 4a so as to surround the first hole 4a. Each tile-shaped member 14 has protrusions 16. The protrusions 16 are inclined leftward with respect to a line extending perpendicularly and radially from the central axis of the fastening member 100 when the bottom surface 2 is viewed from the above as illustrated in FIG. 2B.

A knurl (knurling process) is provided on the side surface of the fastening member 100. As the knurl, an oblique knurl, a flat knurl, a twill knurl, or the like can be used.

Figure 3A:
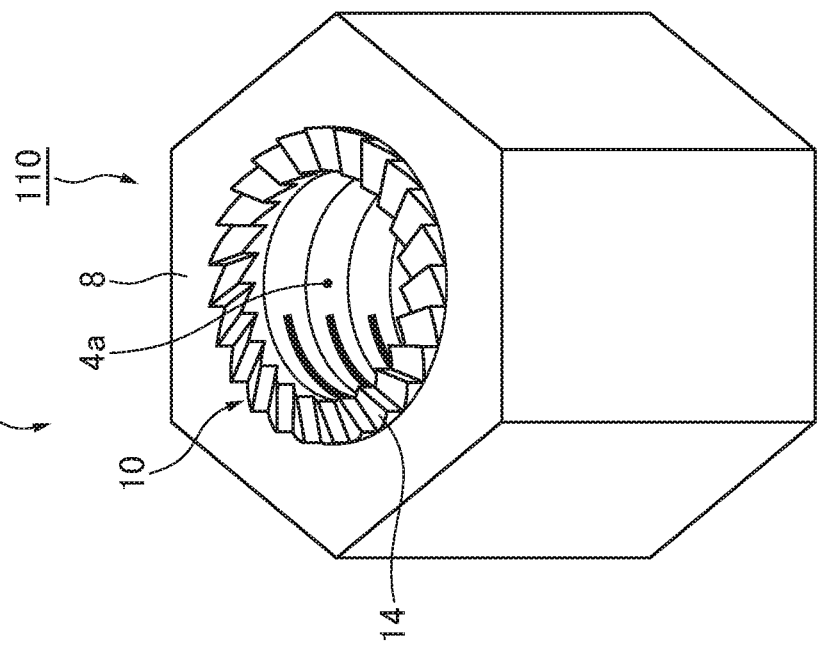

FIGS. 3A and 3B are schematic views of a fastening member according to another aspect of the embodiment. A fastening member 110 illustrated in FIG. 3A has a hexagonal column shape. A fastening member 120 illustrated in FIG. 3B has a triangular columnar shape. These fastening members can also be preferably used. In the case of the fastening members illustrated in FIGS. 3A and 3B, for example, flat knurls or oblique knurls (not illustrated) may be provided on side surfaces. In addition, the shape of the fastening member is not limited to the cylindrical shape, hexagonal columnar shape, and triangular columnar shape described above.

Figure 4A:
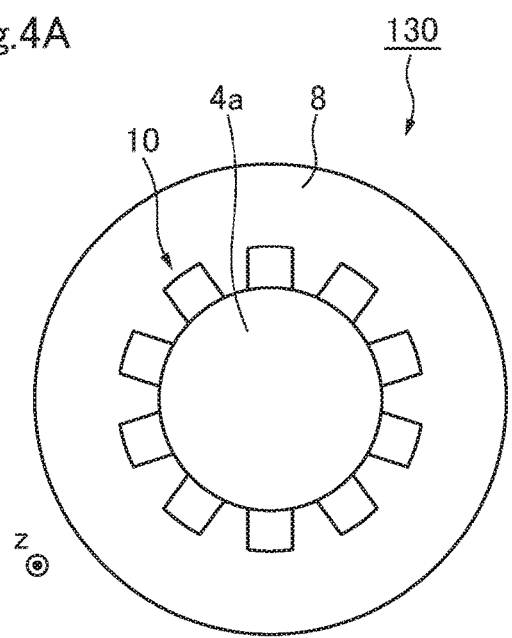
FIGS. 4A to 4D are schematic views of a fastening member according to another aspect of the embodiment.
Figure 4B:
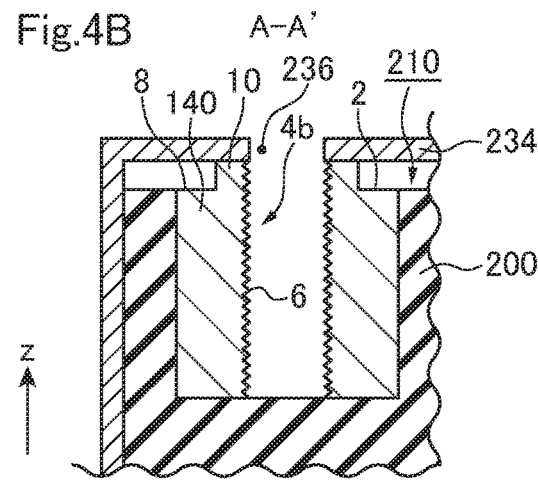
Figure 4C:
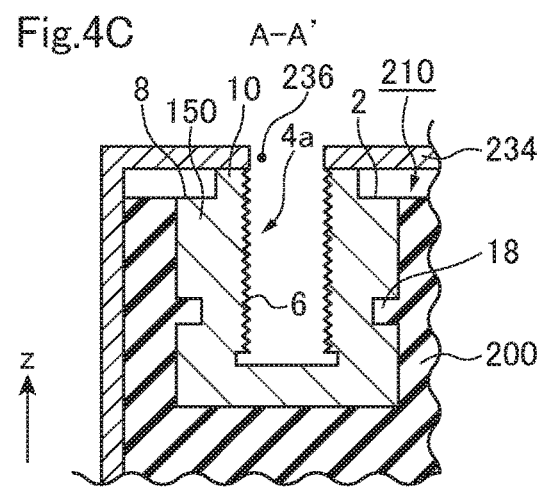
Figure 4D:
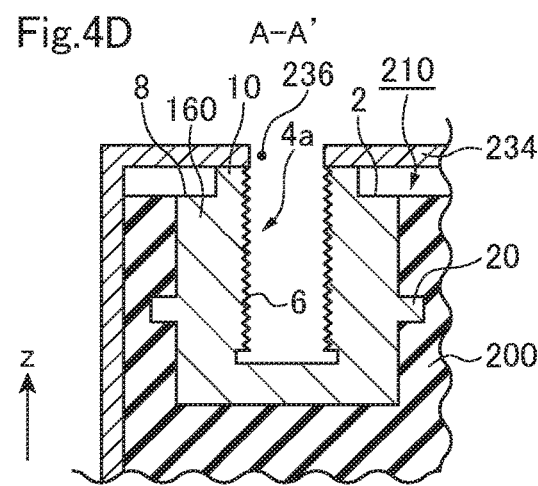

FIGS. 4A to 4D are schematic views of a fastening member according to another aspect of the embodiment. As illustrated in FIG. 4A, a projection 10 of a fastening member 130 may be a plurality of rectangular projections provided around the first hole 4a. The structure of the projection 10 is not limited to that described above. As illustrated in FIG. 4B, a first hole 4b which penetrates a fastening member 140 in the direction parallel to the height direction may be provided. As illustrated in FIG. 4C, a side-surface recess 18 provided so as to surround a side surface may be provided on the side surface of the fastening member 150. In addition, as illustrated in FIG. 4D, a side-surface protrusion 20 provided for processing a side surface may be provided on the side surface of the fastening member 150.

Figure 5:
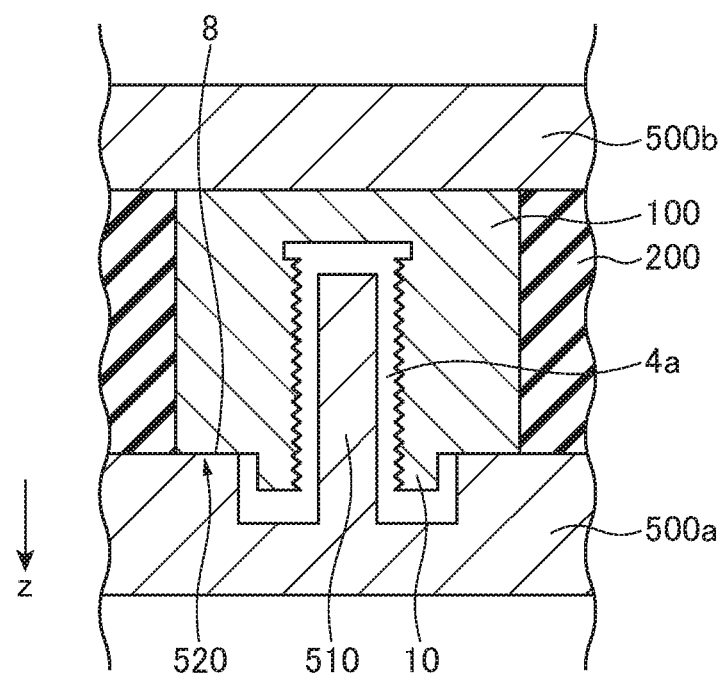
FIG. 5 is a schematic view illustrating a structure around the fastening member in a process of manufacturing the semiconductor device according to the embodiment.

FIG. 5 is a schematic view illustrating a structure around the fastening member 100 in a process of manufacturing the semiconductor device according to the embodiment. The fastening member 100 is fixed between a first resin molding die 500a and a second resin molding die 500b, and the resin which is the material of the container 200 is allowed to flow from the left and right and to be solidified. Thus, the container 200 is formed in a form which is accommodated in the accommodating portion 210. The first resin molding die 500a has a flat surface 520 at a portion corresponding to the planar portion 8 of the fastening member 100. The flat surface 520 and the planar portion 8 are in contact with each other at the time of resin molding, and thus, the resin is prevented from flowing into the inside of the portion which is to be the accommodating portion 210. In addition, a rod 510 is provided at a portion corresponding to the first hole 4a. By inserting the rod 510 into the first hole 4a at the time of resin molding, the fastening member 100 is prevented from moving inside the portion which is to be the accommodating portion 210.

Next, the function and effect of the present embodiment will be described.

In the fastening member 100, a projection 10 is provided. When the bus bar or the like and a portion of the second hole of the terminal plate 240 are inserted between the screw (bolt) and the fastening member 100 and the screw (bolt) is fastened, the projection 10 bites into the bus bar or the like. Therefore, the clockwise force applied to the screw (bolt) described above is suppressed from being applied to the first plate portion 230 and the second plate portion 232. As a result, good fastening is performed, and the occurrence of the problem that the electrical connection between the terminal plate and the semiconductor element is degraded is suppressed. Accordingly, it is possible to provide a fastening member and a semiconductor device with improved reliability.

Since the first hole 4a is a blind hole, the flow of the resin into the inside of the first hole 4a at the time of resin molding is suppressed.

On the other hand, when the first hole 4b is a through hole, the formation of the thread 6 is facilitated.

Since the knurl 12 is provided on the side surface of the fastening member 100, the friction between the fastening member 100 and the sidewall of the accommodating portion 210 becomes large in the accommodating portion 210, and thus, it is difficult for the fastening member 100 to rotate in the accommodating portion. As a result, the fastening can be performed better, and thus, it is possible to provide a fastening member and a semiconductor device with improved reliability.

In a case where the protrusions 16 of the tile-shaped member 14 forming the projection 10 are inclined leftward with respect to a line extending perpendicularly and radially from the central axis of the fastening member as the bottom surface 2 is viewed from the above, if the fastening is performed with the bolt which is a right-handed screw, the protrusions 16 can easily bite into the bus bar. For this reason, the fastening can be performed better, and thus, it is possible to provide a fastening member and a semiconductor device with improved reliability.

In a case where the fastening member is cylindrical, since the fastening member can be manufactured by processing a round bar, it is easy to manufacture the fastening member. Moreover, particularly, it is easy to form a twill knurl on the side surface.

In a case where the side-surface recess 18 or the side-surface protrusion 20 is provided on the side surface of the fastening member, the friction between the side-surface recess 18 or the side-surface protrusion 20 and the accommodating portion 210 becomes large, and thus, the reliability is further improved. In addition, since the fastening member is difficult to remove from the accommodating portion 210, the reliability is also further improved.

While certain embodiments have been described, these embodiments have been presented by way of example only, and are not intended to limit the scope of the inventions. Indeed, fastening members and semiconductor devices described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:
1. A semiconductor device comprising:
  a board;
  a first electrode provided on the board;
  a first semiconductor element electrically connected to the first electrode;
  a second electrode provided on the board, the second electrode being apart from the first electrode;
  a second semiconductor element electrically connected to the second electrode;
  a terminal plate having
    a first plate provided on the first electrode and the first plate connected to the first electrode,
    a second plate provided on the second electrode and the second plate connected to the second electrode, and
    a third plate provided above the first plate and the second plate, the third plate connected to the first plate and the second plate, and the third plate having a second hole;
  a container provided on the board, the container surrounding the first electrode, the first semiconductor element, the second electrode, and the second semiconductor element and having an accommodating portion disposed under the second hole;
a bush provided in the accommodating portion, having a columnar shape, and including
a first hole provided in a direction parallel to a height direction,
a thread provided on a side surface of the first hole,
an upper surface provided around the first hole, and
a projection provided between the upper surface and the first hole; and
a plurality of protrusions provided to be inclined with respect to a line extending perpendicularly from a central axis of the bush in a case where the protrusions are viewed from above, and the plurality of protrusions being surrounded by the upper surface,
a knurl is provided on a side surface of the bush.

2. The semiconductor device according to claim 1, wherein the projection has a plurality of tile-shaped members, each of the tile-shaped members has the protrusion, and the protrusions are provided to be inclined leftward with respect to the line extending perpendicularly and radially from the central axis of the bush in a case where the protrusions are viewed from above.

3. The semiconductor device according to claim 1, wherein the plurality of protrusions is provided to be inclined with respect to the line extending perpendicularly and radially from the central axis of the bush in a case where the protrusions are viewed from above.

4. The semiconductor device according to claim 1, wherein the plurality of protrusions is inclined leftward with respect to the line extending perpendicularly and radially from the central axis of the bush in a case where the protrusions are viewed from above.

5. The semiconductor device according to claim 1, wherein the first hole penetrates the bush in the direction parallel to the height direction.

6. The semiconductor device according to claim 1, wherein the first hole is provided on a bottom surface of the bush.

7. The semiconductor device according to claim 1, further comprising a side-surface protrusion on the side surface.

8. The semiconductor device according to claim 1, further comprising a side-surface recess on the side surface.

9. The semiconductor device according to claim 1, wherein the bush is cylindrical.

10. The semiconductor device according to claim 1, wherein the first hole is a blind hole.

11. A semiconductor device comprising:
a board;
a first electrode provided on the board;
a first semiconductor element electrically connected to the first electrode;
a second electrode member provided on the board;
a second semiconductor element electrically connected to the second electrode;
a terminal plate having
a first plate provided on the first electrode and the first plate connected to the first electrode,
a second plate provided on the second electrode and the second plate connected to the second electrode, and
a third plate provided above the first plate and the second plate, the third plate connected to the first plate and the second plate, and the third plate having a second hole;
a container provided on the board, the container surrounding the first electrode, the first semiconductor element, the second electrode, and the second semiconductor element and having an accommodating portion disposed under the second hole; and
a bush provided in the accommodating portion, having a columnar shape, and including
a first hole provided in a direction parallel to a height direction,
a thread provided on a side surface of the first hole,
an upper surface provided around the first hole, and
a projection provided between the upper surface and the first hole,
wherein a knurl is provided on a side surface of the bush,
and wherein the projection has a plurality of tile-shaped members, each of the tile-shaped members has a protrusion, and the protrusions are provided to be inclined leftward with respect to a line extending perpendicularly and radially from a central axis of the bush in a case where the protrusions are viewed from above.

12. The semiconductor device according to claim 11, wherein the first hole penetrates the bush in the direction parallel to the height direction.

13. The semiconductor device according to claim 11, further comprising a side-surface protrusion on the side surface.

14. The semiconductor device according to claim 11, wherein the first hole is provided on a bottom surface of the bush.

15. The semiconductor device according to claim 11, further comprising a side-surface recess on the side surface.

16. The semiconductor device according to claim 11, wherein the first hole is a blind hole.

17. The semiconductor device according to claim 11, wherein the bush is cylindrical.

* * * * *